United States Patent
Fong et al.

(10) Patent No.: US 9,583,722 B2
(45) Date of Patent: Feb. 28, 2017

(54) ORGANIC THIN FILM TRANSISTOR AND PREPARATION METHOD THEREOF, ARRAY SUBSTRATE AND PREPARATION METHOD THEREOF, AND DISPLAY DEVICE

(71) Applicant: BOE TECHNOLOGY GROUP CO., LTD., Beijing (CN)

(72) Inventors: Honhang Fong, Beijing (CN); Yingtao Xie, Beijing (CN); Shihong Ouyang, Beijing (CN); Shucheng Cai, Beijing (CN); Qiang Shi, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/764,453

(22) PCT Filed: Dec. 4, 2014

(86) PCT No.: PCT/CN2014/093052
§ 371 (c)(1),
(2) Date: Jul. 29, 2015

(87) PCT Pub. No.: WO2016/000399
PCT Pub. Date: Jan. 7, 2016

(65) Prior Publication Data
US 2016/0254467 A1    Sep. 1, 2016

(30) Foreign Application Priority Data

Jul. 4, 2014 (CN) .......................... 2014 1 0319179

(51) Int. Cl.
*H01L 27/32* (2006.01)
*H01L 51/05* (2006.01)
(Continued)

(52) U.S. Cl.
CPC ......... *H01L 51/0541* (2013.01); *H01L 27/283* (2013.01); *H01L 51/0018* (2013.01);
(Continued)

(58) Field of Classification Search
None
See application file for complete search history.

(56) References Cited

U.S. PATENT DOCUMENTS 7,782,416 B2    8/2010    Seo et al.
7,915,074 B2    3/2011    Yoon
(Continued)

FOREIGN PATENT DOCUMENTS

CN     101059631 A     10/2007
CN     101211118 A     7/2008
(Continued)

OTHER PUBLICATIONS

International Search Report with Notice of Transmittal of the International Search Report PCT/CN2014/093052 in Chinese, mailed Apr. 3, 2015.
(Continued)

*Primary Examiner* — Daniel Whalen
(74) *Attorney, Agent, or Firm* — Collard & Roe, P.C.

(57) ABSTRACT

An organic thin film transistor and a preparation method thereof, an array substrate and a preparation method thereof, and a display device; and the preparation method of the organic thin film transistor comprises: forming a source-drain metal layer including a source electrode (12a) and a drain electrode (12b), and forming an organic semiconductor active layer (13) in contact with the source electrode (12a) and the drain electrode (12b); and forming an organic insulating thin film (140) on a substrate (10) where the source-drain metal layer and the organic semiconductor active layer (13) have been formed, thinning the organic
(Continued)

insulating thin film (140) and curing the thinned organic insulating thin film (140), or curing the organic insulating thin film (140) and thinning the cured organic insulating thin film (140), to form an organic insulating layer (14). The method can be used to form a thin and uniform organic insulating layer, so a technical difficulty in forming a via hole is reduced.

19 Claims, 17 Drawing Sheets

(51) Int. Cl.
    *H01L 27/28*     (2006.01)
    *H01L 51/00*     (2006.01)
    *H01L 51/10*     (2006.01)

(52) U.S. Cl.
    CPC ........ *H01L 51/052* (2013.01); *H01L 51/0545* (2013.01); *H01L 51/105* (2013.01); *H01L 27/3274* (2013.01)

(56) References Cited

U.S. PATENT DOCUMENTS

| | | | |
|---|---|---|---|
| 8,450,142 | B2 | 5/2013 | Hotta et al. |
| 8,569,745 | B2 | 10/2013 | Yoneya |
| 2006/0197884 | A1* | 9/2006 | Kim ................ H01L 27/307 349/43 |
| 2007/0252142 | A1 | 11/2007 | Yoon |
| 2008/0237582 | A1* | 10/2008 | Cho ................ H01L 51/0545 257/40 |
| 2013/0187177 | A1 | 7/2013 | Nanai et al. |
| 2014/0225080 | A1* | 8/2014 | Kim ................ H01L 27/3258 257/40 |

FOREIGN PATENT DOCUMENTS

| | | |
|---|---|---|
| CN | 101562154 A | 10/2009 |
| CN | 101971348 A | 2/2011 |
| CN | 101983439 A | 3/2011 |
| CN | 102800629 A | 11/2012 |
| CN | 103210698 A | 7/2013 |
| CN | 104091886 A | 10/2014 |
| KR | 10-2008-0041448 A | 5/2008 |

OTHER PUBLICATIONS

Written Opinion of the International Searching Authority of PCT/CN2014/093052 in Chinese with English translation, mailed Apr. 3, 2015.

Chinese Office Action in Chinese Application No. 201410319179.7 mailed Apr. 6, 2016 with English translation.

* cited by examiner

ORGANIC THIN FILM TRANSISTOR AND PREPARATION METHOD THEREOF, ARRAY SUBSTRATE AND PREPARATION METHOD THEREOF, AND DISPLAY DEVICE

CROSS REFERENCE TO RELATED APPLICATIONS

This application is the National Stage of PCT/CN2014/093052 filed on Dec. 4, 2014, which claims priority under 35 U.S.C. §119 of Chinese Application No. 201410319179.7 filed on Jul. 4, 2014, the disclosure of which is incorporated by reference.

TECHNICAL FIELD

At least one embodiment of the invention relates to an organic thin film transistor and a preparation method thereof, an array substrate and a preparation method thereof, and a display device.

BACKGROUND

Since organic thin film transistors (OTFTs) appeared in mid-80s of the 20$^{th}$ century, they show excellent application prospect in various display devices and storage units, especially in E-paper and flexible display field due to advantages such as light weight, low price, good flexibility and so on, so they have been valued by researchers, and developed rapidly.

The key structure of an OTFT is an organic semiconductor active layer made of an organic semiconductor material, and due to strong activity, most organic semiconductor materials are prepared under low temperature condition (less than 200° C.). Therefore, it is necessary to select a right insulating layer material to cover the organic semiconductor active layer, so that the organic semiconductor active layer is well packaged and protected, thus ensuring that stability of various performances of the organic semiconductor active layer are not affected by other preparation processes.

SUMMARY

At least one embodiment of the invention provides an organic thin film transistor and a preparation method thereof, an array substrate and a preparation method thereof, and a display device, in order to form a thin and uniform organic insulating layer, reduce a technical difficulty in forming a via hole on the organic insulating layer, and improve a technical reliability while effectively packaging and protecting an organic semiconductor active layer.

In one aspect, at least one embodiment of the invention provides a preparation method of an organic thin film transistor, the preparation method comprising: forming a source-drain metal layer including a source electrode and a drain electrode, and an organic semiconductor active layer, the organic semiconductor active layer being in contact with the source electrode and the drain electrode; forming an organic insulating thin film on a substrate where the source-drain metal layer including the source electrode and the drain electrode and the organic semiconductor active layer have been formed; thinning the organic insulating thin film by an etching process and curing the thinned organic insulating thin film by a curing process, or curing the organic insulating thin film by a curing process and thinning the cured organic insulating thin film by an etching thinning process, to form an organic insulating layer; and the preparation method further comprises forming a gate electrode.

In another aspect, at least one embodiment of the invention provides a preparation method of an array substrate, the preparation method comprising: forming an organic thin film transistor, the organic thin film transistor being prepared by the preparation method described above.

In still another aspect, at least one embodiment of the invention provides an organic thin film transistor prepared by the preparation method described above; the organic thin film transistor includes an organic insulating layer located above an organic semiconductor active layer, and the organic insulating layer has a thickness from 300 nm to 500 nm.

In yet another aspect, at least one embodiment of the invention provides an array substrate, the array substrate comprising the organic thin film transistor described above.

In a further aspect, at least one embodiment of the invention further provides a display device, the display device comprising the organic thin film transistor described above or the array substrate described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

Figure 1:
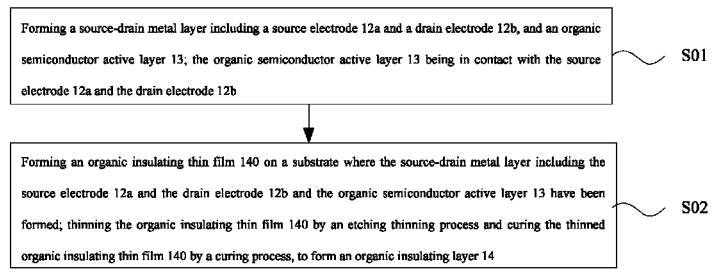
FIG. 1 is a schematic diagram of a preparation process of an organic thin film transistor provided by an embodiment of the invention.

01—organic thin film transistor; 10—base substrate; 11—gate electrode; 12a—source electrode; 12b—drain electrode; 13—organic semiconductor active layer; 130—organic semiconductor thin film; 14—organic insulating layer; 140—organic insulating thin film; 15—gate insulating layer; 16—organic etching blocking layer; 160—organic photosensitive thin film; 160a—completely-retained portion of the organic photosensitive thin film; 160b—completely-removed portion of the organic photosensitive thin film; 160c—half-retained portion of the organic photosensitive thin film; 02—array substrate; 20—planarization layer; 21—via hole; 22—pixel electrode.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The inventors of the application have noted that, in a preparation process of an OTFT, there are mainly two difficulties in adopting an insulating layer material to cover an organic semiconductor active layer for well packaging and protecting the organic semiconductor active layer.

Firstly, an insulating layer made of an inorganic material such as silicon nitride (SiNx), silicon oxide (SiOx) and the like, usually requires higher preparation temperature (e.g., 200° C.-400° C.) and needs to use a kind of corrosive gas in a process of film forming, and activity of organic semiconductor material will be damaged by high temperature and corrosive gas; and therefore, an insulating layer made of inorganic material is not applicable to the OTFT.

Secondly, for an insulating layer made of an organic material such as polyvinyl alcohol (PVA), polyvinyl pyrrolidone (PVP) and the like, its thickness is usually at a micron scale (1 µm-2 µm); after an organic semiconductor active layer is packaged by the insulating layer, when the OTFT is applied to an array substrate, a via hole is required to be formed in the insulating layer for electrically connecting a drain electrode of the OTFT and a pixel electrode, and the insulating layer is quite different from the source and drain electrodes of OTFT in thickness and size, so that a technical difficulty in forming a via hole is increased, and it tends to generate fracture the via hole, thus reducing a technical reliability of the OTFT when applied in the array substrate.

For the above second problem, the inventors of the application have found that, if a thinner insulating layer made of an organic material is directly formed on an organic semiconductor active layer, it is hard to guarantee uniformity and continuity in forming the insulating layer thin film, resulting in decrease of coverage of the insulating layer on the organic semiconductor active layer or short of coverage on an edge of a gap between the source electrode and the drain electrode, thus affecting efficiency of the insulating layer for packaging and protecting the organic semiconductor active layer; moreover, if a thinner insulating layer made of an organic material is directly formed, problems such as too rough surface may appear, resulting in decrease of flatness of the insulating layer, and affecting the following film forming process(es).

Therefore, how to form a thin and uniform organic insulating layer, to reduce the technical difficulty in forming a via hole in the organic insulating layer while effectively packaging and protecting an organic semiconductor active layer, has become a urgent problem to be solved by a person of skill in the art.

At least one embodiment of the invention provides a preparation method of an organic thin film transistor 01, the preparation method comprising: forming a source-drain metal layer including a source electrode and a drain electrode, and forming an organic semiconductor active layer being in contact with the source electrode and the drain electrode; forming an organic insulating thin film on a substrate where the source-drain metal layer including the source electrode and the drain electrode and the organic semiconductor active layer have been formed; thinning the organic insulating thin film by an etching thinning process and curing the thinned organic insulating thin film by a curing process, or curing the organic insulating thin film by a curing process and thinning the cured organic insulating thin film by an etching thinning process, to form an organic insulating layer. The following embodiments are illustrated by taking an example of thinning the organic insulating thin film by an etching thinning process and curing the thinned organic insulating thin film by a curing process to form an organic insulating layer.

As shown in FIG. 1, the preparation method comprises steps of:

Step S01: forming a source-drain metal layer including a source electrode 12a and a drain electrode 12b, and forming an organic semiconductor active layer 13; the organic semiconductor active layer 13 is in contact with the source electrode 12a and the drain electrode 12b, as shown in FIG. 4(a) to FIG. 13(b).

Step S02: forming an organic insulating thin film 140 on a substrate where the source-drain metal layer including the source electrode 12a and the drain electrode 12b and the organic semiconductor active layer 13 have been formed; thinning the organic insulating thin film 140 by an etching thinning process, and curing the thinned organic insulating thin film 140 for a curing process, to form an organic insulating layer 14, as shown in FIG. 14(a) to FIG. 18(d).

In the above embodiment, the preparation method further comprises forming a gate electrode 11.

It should be noted that, firstly, the organic thin film transistor 01 can be divided into different types according to different classification standards. For example, according to different depositing sequences of the source electrode 12a, the drain electrode 12b and the gate electrode 11 in the organic thin film transistor 01, the organic thin film transistor 01 can be divided into a bottom-gate type and a top-gate type.

Figure 2A:
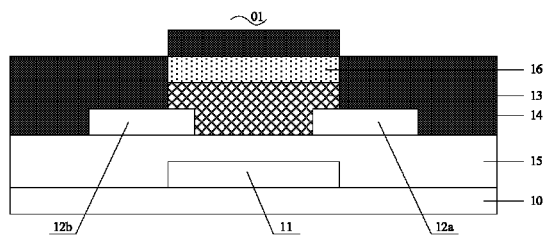
FIG. 2(a) is a structural schematic diagram of a bottom-gate bottom-contact type provided by an embodiment of the invention.
Figure 2B:
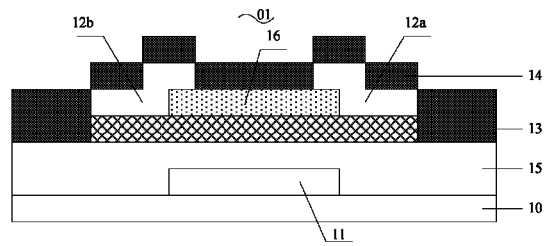
FIG. 2(b) is a structural schematic diagram of a bottom-gate top-contact type provided by the embodiment of the invention.

For example, as shown in FIG. 2(a) and FIG. 2(b), in a case where the organic thin film transistor 01 to be formed is of a bottom-gate type, the source-drain metal layer including the source electrode 12a and the drain electrode 12b and the organic semiconductor active layer 13 are formed on a base substrate 10 including the gate electrode 11 and the gate insulating layer 15 formed thereon.

Figure 3A:
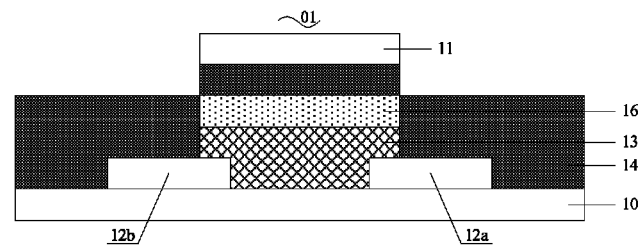
FIG. 3(a) is a structural schematic diagram of a top-gate bottom-contact type provided by an embodiment of the invention.
Figure 3B:
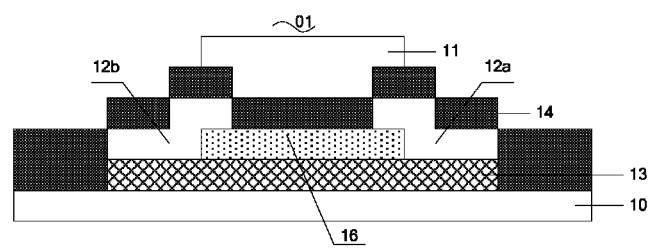
FIG. 3(b) is a structural schematic diagram of a top-gate top-contact type provided by the embodiment of the invention.

For example, as shown in FIG. 3(a) and FIG. 3(b), in a case where the organic thin film transistor 01 to be formed is of a top-gate type, the source-drain metal layer including the source electrode 12a and the drain electrode 12b and the organic semiconductor active layer 13 are formed on a base substrate 10; in that case, the gate electrode 11 is formed on a substrate including the organic insulating layer 14.

In addition, according to different depositing sequences of the source electrode 12a, the drain electrode 12b and the organic semiconductor active layer 13 in the organic thin film transistor 01, the organic thin film transistor 01 can be divided into a bottom-contact type and a top-contact type. If the source electrode 12a and the drain electrode 12b are below the organic semiconductor active layer 13, it is called a bottom-contact type, as shown in FIG. 2(a) and FIG. 3(a); on the contrary, if the source electrode 12a and the drain electrode 12b are above the organic semiconductor active layer 13, it is called a top-contact type, as shown in FIG. 2(b) and FIG. 3(b).

The preparation method provided by the embodiment of the present invention is applicable to various types of organic thin film transistors, i.e., a bottom-gate bottom-contact type shown in FIG. 2(a), a bottom-gate top-contact type shown in FIG. 2(b), a top-gate bottom-contact type shown in FIG. 3(a) and a top-gate top-contact type shown in FIG. 3(b).

Secondly, in the above step S01, in a case where the organic thin film transistor 01 is of a bottom-contact type, as shown in FIG. 2(a) and FIG. 3(a), when the organic semiconductor active layer 13 is in contact with the source electrode 12a and the drain electrode 12b, part of the drain electrode 12b may be exposed, i.e., if the organic thin film transistor 01 is applied in an array substrate, and the drain electrode 12b is electrically connected with the pixel electrode through a via hole, when the via hole passing though the organic insulating layer 14 is formed, it is not necessary for the via hole to run through the organic semiconductor active layer 13, which avoids damage to the organic semiconductor active layer 13 by the etching process.

Thirdly, in the above step S02, the etching thinning process is to thin the organic insulating thin film 140, for example, the organic insulating thin film 140 can be directly thinned to a corresponding thickness in a one-step thinning manner, or the organic insulating thin film 140 is thinned in a multi-step gradually thinning manner, and finally thinned to the corresponding thickness; the process can be flexibly adjusted according to thickness and material of the organic insulating thin film 140 to be formed, which is not limited by the embodiment of the present invention.

Fourthly, also in the above step S02, the etching thinning process, for example, may be a wet etching process, or a plasma dry etching process (e.g., $O_2$ plasma); the curing process, for example, may be a hot curing process by baking, or an ultraviolet curing process, or a combination thereof; suitable etching thinning process and curing process can be selected according to thickness and material of the organic insulating thin film 140 to be formed, which is not limited by the embodiment of the present invention.

Fifthly, as shown in FIG. 3(a) and FIG. 3(b), in a case where the organic thin film transistor 01 is of a top-contact type, the organic insulating layer 14 plays a role of insulating the gate electrode 11 from the organic semiconductor active layer 13, the source electrode 12a and the drain electrode 12b, while packaging and protecting the organic semiconductor active layer 13, the source electrode 12a and the drain electrode 12b.

At least one embodiment of the invention provides a preparation method of an organic thin film transistor 01, the preparation method comprising: forming a source-drain metal layer including a source electrode 12a and a drain electrode 12b, and forming an organic semiconductor active layer 13, the organic semiconductor active layer 13 being in contact with the source electrode 12a and the drain electrode 12b; forming an organic insulating thin film 140 on a substrate where the source-drain metal layer including the source electrode 12a and the drain electrode 12b and the organic semiconductor active layer 13 have been formed; thinning the organic insulating thin film 140 by an etching thinning process and curing the organic insulating thin film 140 by a curing process, to form an organic insulating layer 14. In the embodiment of the present invention, the preparation method further comprises forming a gate electrode 11.

When the preparation method provided by the embodiment of the present invention is used, because the organic insulating thin film 140 with a larger film thickness is formed at first, it can be ensured that the formed organic insulating thin film 140 has good uniformity and continuity in film formation, avoiding decrease in coverage on the organic semiconductor active layer 13 due to smaller film thickness or short of coverage on an edge of a gap between the source electrode 12a and the drain electrode 12b. Later, the organic insulating thin film 140 which has been already deposited is subjected to an etching thinning process, so the organic insulating layer 14 with a smaller film thickness can be obtained.

On such basis, the preparation method overcomes a shortcoming that it is hard to form a uniform and continuous thin film when an organic insulating layer with smaller film thickness is directly formed, so that a thin and uniform organic insulating layer 14 is formed, while effectively packaging and protecting the organic semiconductor active layer 13; when the organic thin film transistor 01 is applied in an array substrate, because the pixel electrode is electrically connected with the drain electrode 12b of the organic thin film transistor 01, and the organic insulating layer 14 between the pixel electrode and the drain electrode 12b has a smaller film thickness, the technical difficulty of forming a via hole in the organic insulating layer 14 is reduced, the technical reliability is improved, and the method has very important value in actual applications.

In one embodiment, before forming the organic insulating thin film 140, the above step S01 further includes: forming an organic etching blocking layer 16. The organic etching blocking layer 16 is located above the organic semiconductor active layer 13, and the organic etching blocking layer 16 corresponds to a gap between the source electrode 12a and the drain electrode 12b.

Herein, the "above" in connection with the organic semiconductor active layer 13 refers to the side of the organic semiconductor active layer 13 away from the base substrate 10, and the organic etching blocking layer 16 is used for protecting the surface of a region of the organic semiconductor active layer 13 corresponding to the gap between the source electrode 12a and the drain electrode 12b.

On this basis, according to different depositing sequences of the source electrode 12a, the drain electrode 12b and the organic semiconductor active layer 13 in the organic thin film transistor, the above step S01, for example, may include two cases, which are described in detail hereinafter.

In a first case contained in the above step S01, for an organic thin film transistor of bottom-contact type, the above step S01, for example, may include four sub-steps, which are described one by one hereinafter.

Figure 4A:
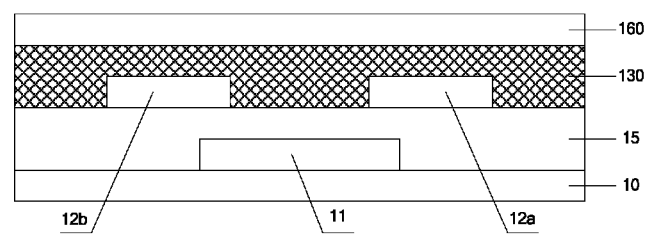
FIG. 4(a) and FIG. 4(b) are schematic diagram I and schematic diagram II of forming an organic semiconductor thin film and an organic photosensitive thin film on a substrate where a source electrode and a drain electrode have been formed for an organic thin film transistor of bottom-contact type, sequentially.
Figure 4B:
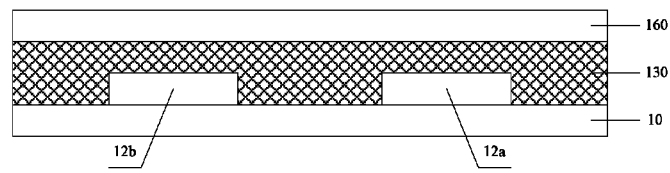

Step S11: as shown in FIG. 4(a) and FIG. 4(b), forming an organic semiconductor thin film 130 and an organic photosensitive thin film 160 sequentially on a substrate where the source-drain metal layer including the source electrode 12a and the drain electrode 12b have been formed.

It should be noted that, firstly, referring to FIG. 4(a), in a case where the organic thin film transistor 01 to be formed is of a bottom-gate bottom-contact type, the substrate where the source-drain metal layer including source electrode 12a and the drain electrode 12b are formed is a base substrate 10 including a gate electrode 11 and a gate insulating layer 15. The gate insulating layer 15 can be made of an insulating material such as metal oxide, metal nitride, an organic material or the like, and may have a thickness, for example, from 30 nm to 1000 nm. Referring to FIG. 4(b), in a case where the organic thin film transistor 01 to be formed is of a top-gate bottom-contact type, the source-drain metal layer including source electrode 12a and the drain electrode 12b is formed on the base substrate 10. After a gate electrode is formed on a substrate of FIG. 4(b), the situation is shown in FIG. 3(a), at that time the gate electrode 11, for example, can be made of a metal material, an indium tin oxide (ITO) material, a doped silicon material, or an organic conductive material, and may have a thickness of, for example, 20 nm-200 nm; the source electrode 12a and the drain electrode 12b, for example, can be made of metal material (such as Au, Ag, Mo, Al, Cu, etc.) or ITO, and may have a thickness, for example, from 20 nm to 300 nm.

Secondly, the organic semiconductor thin film 130, for example, can be made of an organic semiconductor material such as pentacene, metallo phthalocyanine compounds, thienyl-polymers or polycyclic aromatic polymers and so on, and the depositing method can still use a technology known by a person of skill in the art, which is not limited here.

Thirdly, the organic photosensitive thin film, for example, can be made of a photoresist material, or can be made of a photosensitive polymer material which will undergo a photochemical reaction (e.g., a photo-crosslinking or photo-degrading) under light irradiation.

Figure 5A:
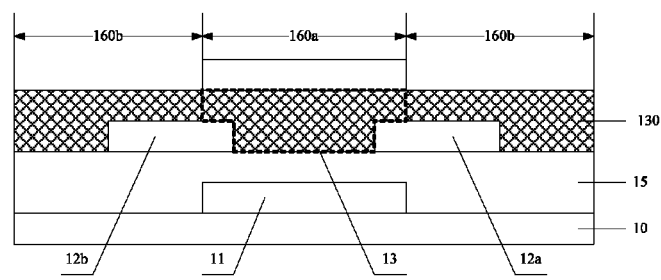
FIG. 5(a) is a schematic diagram of forming a completely-retained portion and a completely-removed portion of the organic photosensitive thin film on the basis of FIG. 4(a)
Figure 5B:
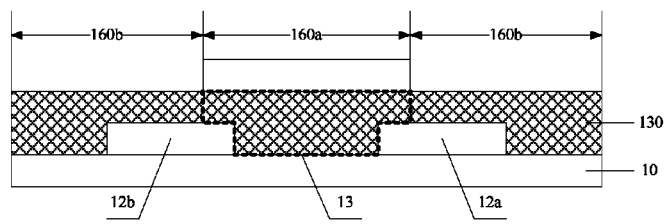
FIG. 5(b) is a schematic diagram of forming a completely-retained portion and a completely-removed portion of the organic photosensitive thin film on the basis of FIG. 4(b)

Step S12: as shown in FIG. 5(a) or FIG. 5(b), exposing and developing the substrate, on which the organic photosensitive thin film 160 has been formed, by using a common mask plate, and forming a completely-retained portion 160a of the organic photosensitive thin film and a completely-removed portion 160b of the organic photosensitive thin film.

In the step, the completely-retained portion 160a of the organic photosensitive thin film corresponds to a region of an organic semiconductor active layer 13 to be formed, while the completely-removed portion 160b of the organic photosensitive thin film corresponds to the rest regions.

Figure 6A:
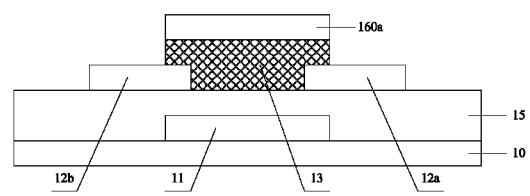
FIG. 6(a) is a schematic diagram of forming an organic semiconductor active layer on the basis of FIG. 5(a)
Figure 6B:
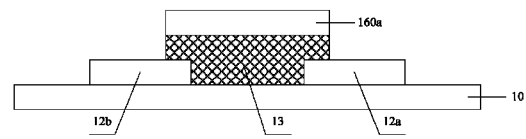
FIG. 6(b) is a schematic diagram of forming an organic semiconductor active layer on the basis of FIG. 5(b)

Step S13: as shown in FIG. 6(a) or FIG. 6(b), removing the organic semiconductor thin film 130 (not shown) exposed by the completely-removed portion 160b (not shown) of the organic photosensitive thin film by an etching process, to form the organic semiconductor active layer 13.

In the step, the formed organic semiconductor active layer 13 exposes part of the drain electrode 12b and part of the source electrode 12a.

Figure 7A:
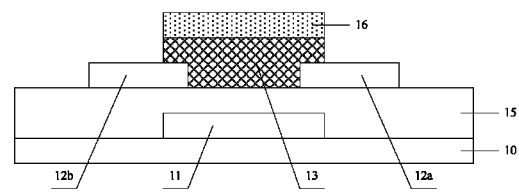
FIG. 7(a) is a schematic diagram of forming an organic etching blocking layer on the basis of FIG. 6(a)
Figure 7B:
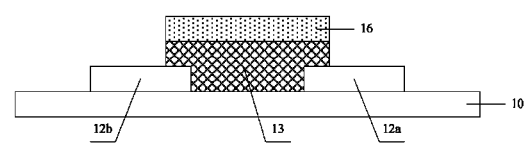
FIG. 7(b) is a schematic diagram of forming an organic etching blocking layer on the basis of FIG. 6(b)

Step S14: as shown in FIG. 7(a) or FIG. 7(b), curing the completely-retained portion 160a (not shown) of the organic photosensitive thin film formed on the organic semiconductor active layer 13 by a curing process, to form the organic etching blocking layer 16.

It should be noted that, an organic semiconductor active layer with a certain pattern is often formed by a patterning process, and a typical patterning process refers to a process of etching and removing photoresist through exposure and development by using a mask plate for one time; since a magnitude of thickness of the organic semiconductor active layer (usually 10 nm-200 nm) is less than a magnitude of thickness of the photoresist (usually 500 nm-1000 nm), when the retained photoresist on the surface of the organic semiconductor active layer are removed by an ashing process (e.g., dry etching) or stripping (e.g., wet etching), the organic semiconductor active layer may be possibly stripped together, or in the process of removing the photoresist, the surface of the organic semiconductor active layer corresponding to the gap between the source electrode and the drain electrode may be damaged, affecting performance of the organic thin film transistor.

Therefore, by using the above step S14, not only the step for removing the retained photoresist from the surface of the organic semiconductor active layer is saved, but the cured organic etching blocking layer 16 can protect the surface of the organic semiconductor active layer 13 from being damaged.

In a second case included in the above step S01, for an organic thin film transistor of top-contact type, the above step S01, for example, may include six sub-steps, which are described one by one hereinafter.

Figure 8A:
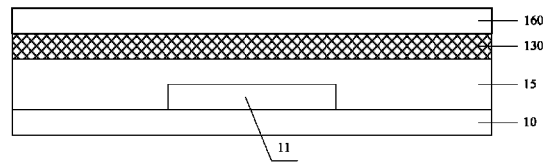
FIGS. 8(a) and 8(b) are schematic diagram I and schematic diagram II of forming an organic semiconductor thin film and an organic photosensitive thin film on a substrate for an organic thin film transistor of top-contact type, sequentially.
Figure 8B:
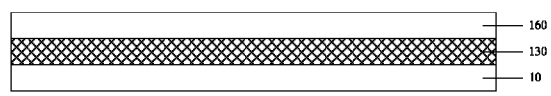

Step S21: as shown in FIG. 8(a) and FIG. 8(b), forming an organic semiconductor thin film 130 and an organic photosensitive thin film 160 sequentially.

It should be noted that, firstly, referring to FIG. 8(a), in a case where the organic thin film transistor 01 to be formed is of a bottom-gate top-contact type, the organic semiconductor thin film 130 and the organic photosensitive thin film 160 are sequentially formed on a base substrate 10 including the gate electrode 11 and the gate insulating layer 15 formed thereon. Referring to FIG. 8(b), in a case where the organic thin film transistor 01 to be formed is of a top-gate top-contact type, the organic semiconductor thin film 130 and the organic photosensitive thin film 160 are sequentially formed on the base substrate 10.

Secondly, the materials of the organic semiconductor thin film 130 and the organic photosensitive thin film 160 can be referred to step 11, which will be not repeated herein.

Figure 9A:
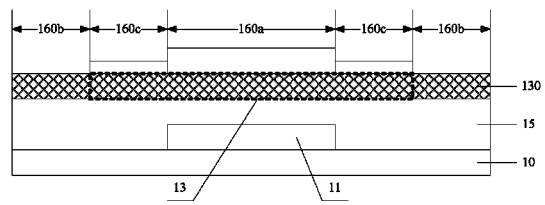
FIG. 9(a) is a schematic diagram of forming a completely-retained portion, a completely-removed portion, and a half-retained portion of the organic photosensitive thin film on the basis of FIG. 8(a)
Figure 9B:
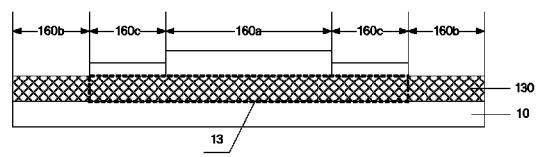
FIG. 9(b) is a schematic diagram of forming a completely-retained portion, a completely-removed portion, and a half-retained portion of the organic photosensitive thin film on the basis of FIG. 8(b)

Step S22: as shown in FIG. 9(a) and FIG. 9(b), after exposing and developing the substrate where the organic photosensitive thin film 160 has been formed by using a half-tone mask plate or a gray-tone mask plate, forming a completely-retained portion 160a of the organic photosensitive thin film, a completely-removed portion 160b of the organic photosensitive thin film, and a half-retained portion 160c of the organic photosensitive thin film.

In the step, the completely-retained portion 160a of the organic photosensitive thin film corresponds to a region of an organic etching blocking layer 16 to be formed, the half-retained portion 160c of the organic photosensitive thin film corresponds to a region of an organic semiconductor active layer 13 to be formed, where is not covered by the organic etching blocking layer 16, and the completely-removed portion 160b of the organic photosensitive thin film corresponds to the rest regions.

Figure 10A:
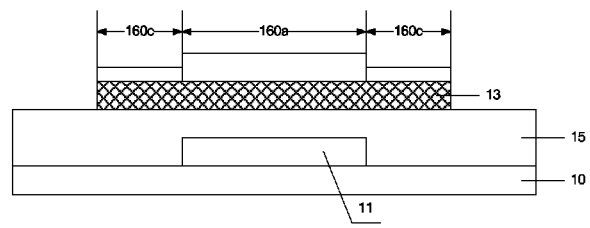
FIG. 10(a) is a schematic diagram of forming an organic semiconductor active layer on the basis of FIG. 9(a)
Figure 10B:
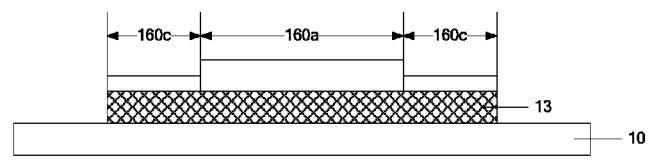
FIG. 10(b) is a schematic diagram of forming an organic semiconductor active layer on the basis of FIG. 9(b)

Step S23: as shown in FIG. 10(a) or FIG. 10(b), removing the organic semiconductor thin film 130 exposed the completely-retained portion 160b (not shown) of the organic photosensitive thin film by an etching process, to form the organic semiconductor active layer 13.

Figure 11A:
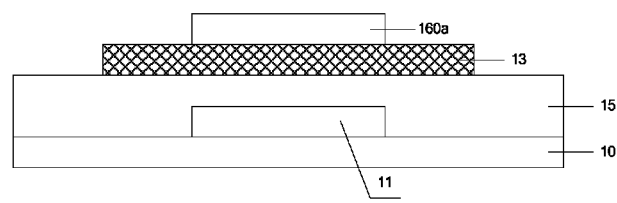
FIG. 11(a) is a schematic diagram of removing the half-retained portion of the organic photosensitive thin film to expose the organic semiconductor active layer on the basis of FIG. 10(a)
Figure 11B:
FIG. 11(b) is a schematic diagram of removing the half-retained portion of the organic photosensitive thin film to expose the organic semiconductor active layer on the basis of FIG. 10(b)

Step S24: as shown in FIG. 11(a) or FIG. 11(b), removing the organic photosensitive thin film 160 in the half-retained portion 160c (not shown) of the organic photosensitive thin film by an ashing process, to expose a region of the organic semiconductor active layer 13 corresponding to the half-retained portion 160c of the organic photosensitive thin film.

Figure 12A:
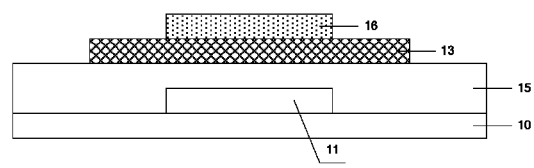
FIG. 12(a) is a schematic diagram of forming an organic etching blocking layer on the basis of FIG. 11(a)
Figure 12B:
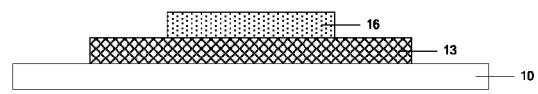
FIG. 12(b) is a schematic diagram of forming an organic etching blocking layer on the basis of FIG. 11(b)

Step S25: as shown in FIG. 12(a) or FIG. 12(b), curing the completely-retained portion 160a (not shown) of the organic photosensitive thin film formed on the organic semiconductor active layer 13 by a curing process, to form the organic etching blocking layer 16.

Figure 13A:
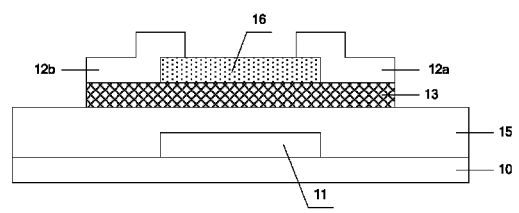
FIG. 13(a) is a schematic diagram of forming a source electrode and a drain electrode on the basis of FIG. 12(a)
Figure 13B:
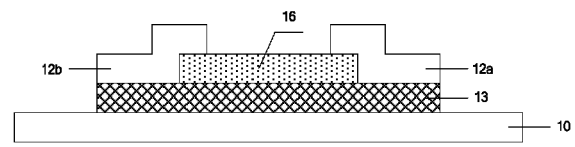
FIG. 13(b) is a schematic diagram of forming a source electrode and a drain electrode on the basis of FIG. 12(b)
Figure 14A:
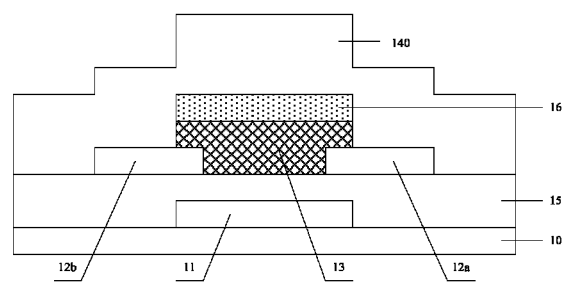
FIG. 14(a) is a schematic diagram of forming an organic insulating thin film on the basis of FIG. 7(a)
Figure 14B:
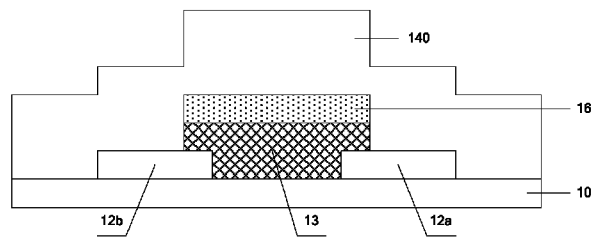
FIG. 14(b) is a schematic diagram of forming an organic insulating thin film on the basis of FIG. 7(b)
Figure 14C:
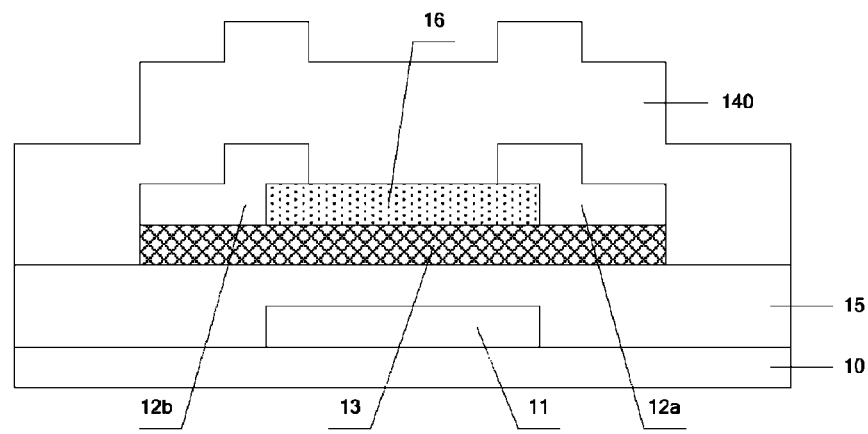
FIG. 14(c) is a schematic diagram of forming an organic insulating thin film on the basis of FIG. 13(a)
Figure 14D:
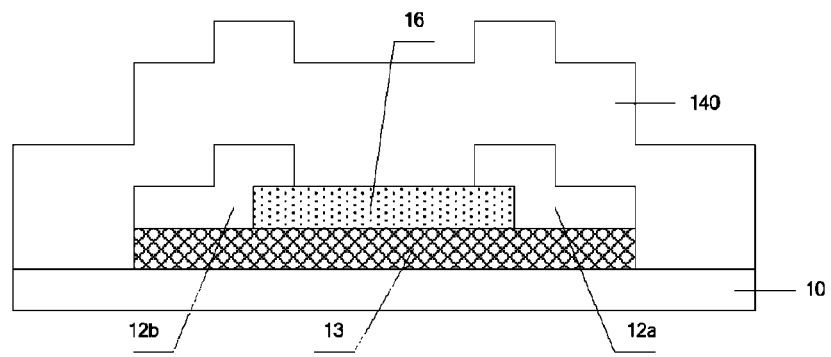
FIG. 14(d) is a schematic diagram of forming an organic insulating thin film on the basis of FIG. 13(b)
Figure 15A:
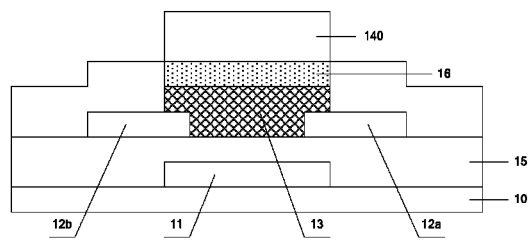
FIG. 15(a) is a schematic diagram of thinning the organic insulating thin film by a first etching thinning process on the basis of FIG. 14(a)
Figure 15B:
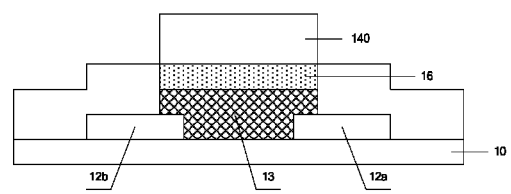
FIG. 15(b) is a schematic diagram of thinning the organic insulating thin film by a first etching thinning process on the basis of FIG. 14(b)
Figure 15C:
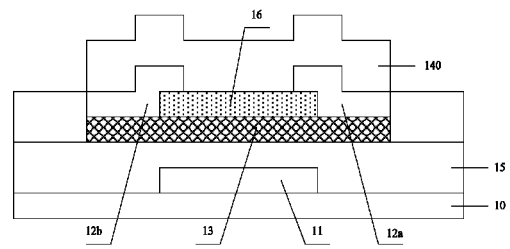
FIG. 15(c) is a schematic diagram of thinning the organic insulating thin film by a first etching thinning process on the basis of FIG. 14(c)
Figure 15D:
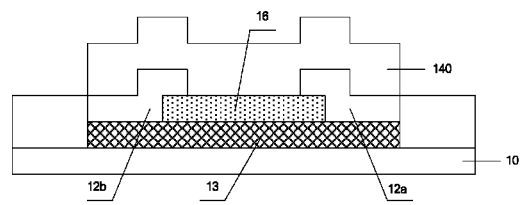
FIG. 15(d) is a schematic diagram of thinning the organic insulating thin film by a first etching thinning process on the basis of FIG. 14(d)
Figure 16A:
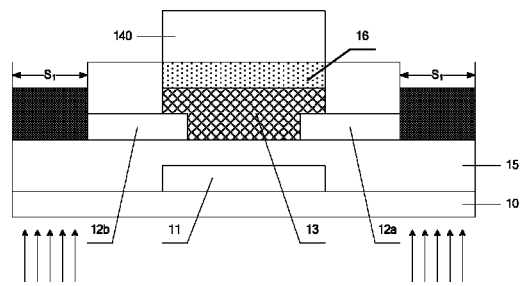
FIG. 16(a) is a schematic diagram of curing first regions which have completed step S34 on the basis of FIG. 15(a)
Figure 16B:
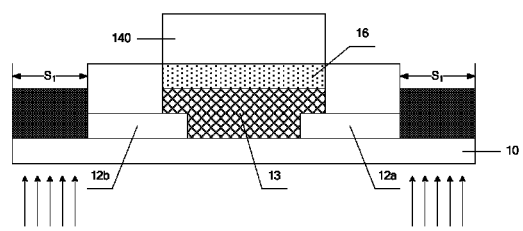
FIG. 16(b) is a schematic diagram of curing first regions which has completed step S34 on the basis of FIG. 15(b)
Figure 16C:
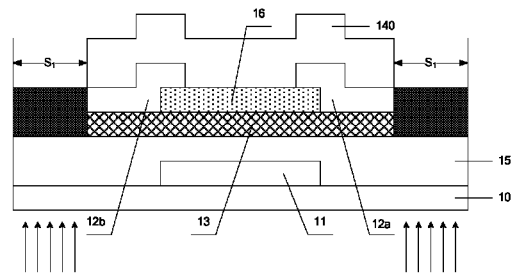
FIG. 16(c) is a schematic diagram of curing first regions which has completed step S34 on the basis of FIG. 15(c)
Figure 16D:
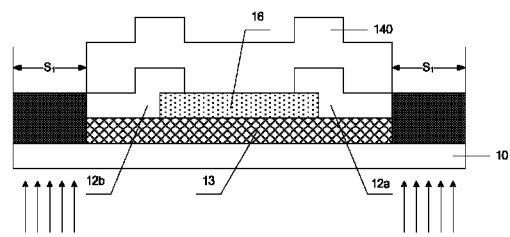
FIG. 16(d) is a schematic diagram of curing first regions which has completed step S34 on the basis of FIG. 15(d)
Figure 17A:
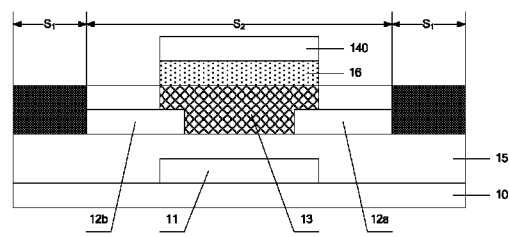
FIG. 17(a) is a schematic diagram of thinning second regions on the basis of FIG. 16(a)
Figure 17B:
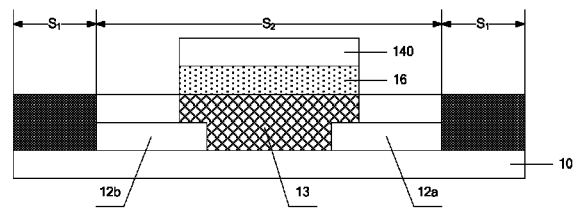
FIG. 17(b) is a schematic diagram of thinning second regions on the basis of FIG. 16(b)
Figure 17C:
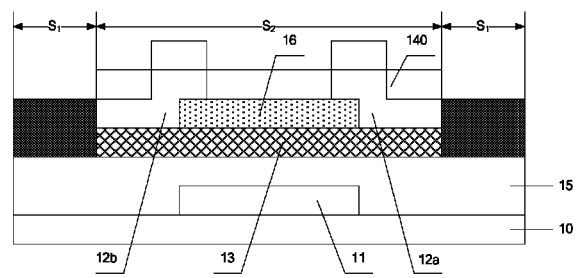
FIG. 17(c) is a schematic diagram of thinning second regions on the basis of FIG. 16(c)
Figure 17D:
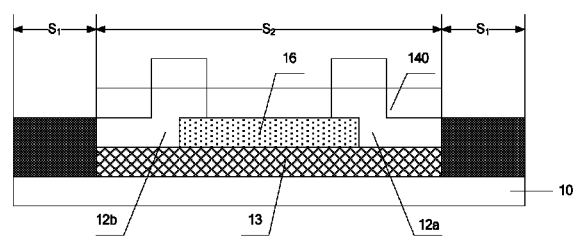
FIG. 17(d) is a schematic diagram of thinning second regions on the basis of FIG. 16(d)
Figure 18A:
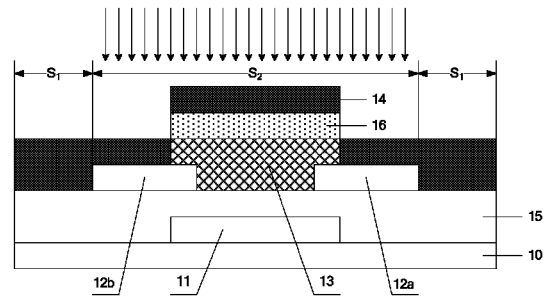
FIG. 18(a) is a schematic diagram of forming an organic insulating layer on the basis of FIG. 17(a)
Figure 18B:
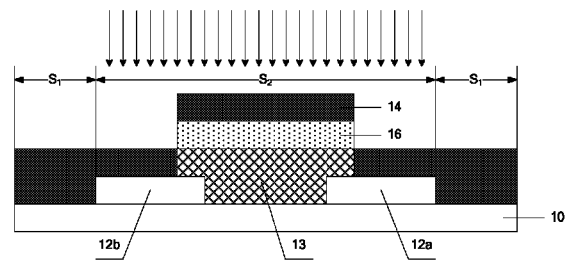
FIG. 18(b) is a schematic diagram of forming an organic insulating layer on the basis of FIG. 17(b)
Figure 18C:
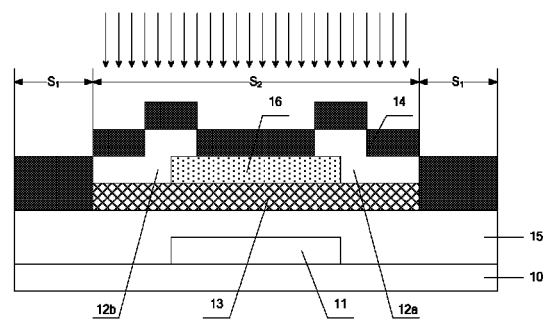
FIG. 18(c) is a schematic diagram of forming an organic insulating layer on the basis of FIG. 17(c)
Figure 18D:
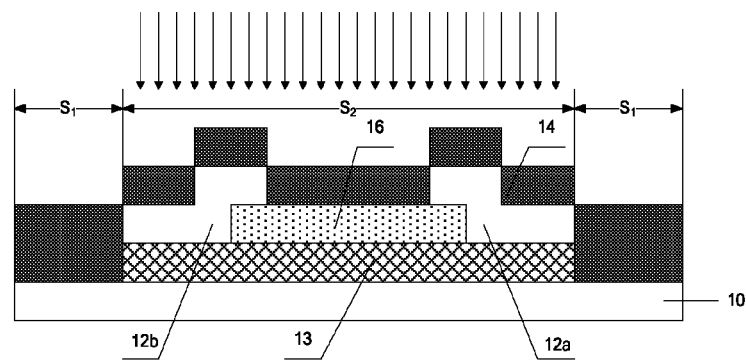
FIG. 18(d) is a schematic diagram of forming an organic insulating layer on the basis of FIG. 17(d)

Step S26: as shown in FIG. 13(a) or FIG. 13(b), forming a source-drain metal layer including the source electrode 12a and the drain electrode 12b on a substrate where the organic semiconductor active layer 13 and the organic etching blocking layer 16 are formed.

Based on the above description, both step S14 and step S25 include two sub-steps, i.e., firstly, curing the completely-retained portion 160a of the organic photosensitive thin film formed on the organic semiconductor active layer 13 by a curing process; secondly, thinning the cured completely-retained portion 160a of the organic photosensitive thin film by an etching thinning process, to form the organic etching blocking layer 16. Or, the above step S14 and step S25 may include: before curing the completely-retained portion 160a of the organic photosensitive thin film formed on the organic semiconductor active layer by a curing process, thinning the completely-retained portion of the organic photosensitive thin film by an etching thinning process, to form the organic etching blocking layer.

The formed organic etching blocking layer 16 is thinned by the etching thinning process, to provide a more flat substrate for the following film forming process, and avoid forming non-uniform film.

Here, considering that the wet etching process has poor control in forming a pattern with a smaller feature size, the etching thinning process is preferably a plasma etching process, for example, an oxygen plasma etching, to more accurately control a speed of etching.

Herein, for example, the completely-retained portion 160a of the organic photosensitive thin film formed on the organic semiconductor active layer 13 can be cured by way of baking.

Herein, in comprehensive consideration of preparation costs of the organic photosensitive thin film and an appropriate thickness of the organic etching blocking layer 16 finally formed, in at least one embodiment, the completely-retained portion 160a of the organic photosensitive thin film formed on the organic semiconductor active layer 13 may have a thickness of 500 nm-1000 nm. Thereafter, in at least one embodiment, the completely-retained portion 160a of the organic photosensitive thin film thinned by the etching thinning process may have a thickness of 300 nm-500 nm.

Base on that the liquid organic photosensitive material has better surface covering capability, to get better contact with the organic semiconductor thin film 130, in at least one embodiment, in step S11 and step S21 described above, the organic photosensitive thin film 160 can be formed through a solution coating process.

Her "solution coating" refers to a technology of depositing a thin film on a substrate surface by using a chemical method such as chemical reaction or electrochemical reaction in solution. For example, the solution coating process may involve a chemical coating process, a sol-gel method process, an electroplating process, a coating process, a spin-coating process, a Langmuir-Blodgett (LB) process, and the like. The solution coating process does not need a vacuum condition, requires simple instruments, can form a film on surfaces of various substrates, and raw materials are easy to get, so the solution coating has a much wider prospect in application.

Based on the above, the above step S02, for example, may include seven sub-steps, which are described one by one hereinafter.

S31: as shown in FIG. 14(a), or FIG. 14(b), or FIG. 14(c), or FIG. 14(d), forming an organic insulating thin film 140 on a substrate where the source-drain metal layer including the source electrode 12a and the drain electrode 12b, the organic semiconductor active layer 13 and the organic etching blocking layer have been formed thereon.

The organic insulating thin film 140, for example, may be photosensitive high-molecular compound (e.g., UV curing adhesive), or polyvinyl chloride (PVC), or polyethylene terephthalate (PET), or polyethylene naphthalate (PEN), or polyimide (PI), or polyvinyl chloride (PVC) or polytetrafluoroethylene (PTFE), etc.

S32: pre-baking the formed organic insulating thin film 140 at a first temperature. For example, the first temperature can be 110° C.-150° C.

S33: as shown in FIG. 15(a), or FIG. 15(b), or FIG. 15(c), or FIG. 15(d), thinning the organic insulating thin film 140 pre-baked at the first temperature, by a first etching thinning process.

S34: pre-baking the thinned organic insulating thin film 140 at a second temperature. For example, the second temperature can be 150° C.-200° C.

S35: as shown in FIG. 16(a), or FIG. 16(b), or FIG. 16(c), or FIG. 16(d), curing first regions (marked as $S_1$ in the diagrams) of the organic insulating thin film 140 pre-baked at the second temperature, by a first curing process.

In the step, the first regions $S_1$ are the rest regions of the organic insulating thin film 140 except regions above the source electrode 12a, above the drain electrode 12b, and above the gap between the source electrode 12a and the drain electrode 12b.

S36: as shown in FIG. 17(a), or FIG. 17(b), or FIG. 17(c), or FIG. 17(d), thinning second regions (marked as $S_2$ in the diagrams) of the organic insulating thin film 140 processed by the first curing process, by a second etching thinning process.

In the step, the second regions $S_2$ are the regions of the organic insulating thin film 140 above the source electrode 12a, above the drain electrode 12b, and above the gap between the source electrode 12a and the drain electrode 12b.

S37: as shown in FIG. 18(a), or FIG. 18(b), or FIG. 18(c), or FIG. 18(d), curing the second regions $S_2$ of the organic insulating thin film 140 processed by the second etching thinning process, by a second curing process, to form an organic insulating layer 14.

Gradually curing and thinning in the above steps S32 to S37, can flexibly control technical parameters of thinning, also can avoid deformation and cracking of organic materials due to fast heating when the organic materials are directly cured after thinning.

Herein, in comprehensive consideration of the preparation costs of the organic insulating thin film and the appropriate thickness of the organic insulating layer 14 finally formed, in at least one embodiment, the formed organic insulating thin film 140 may have a thickness from 500 nm to 1000 nm. In at least one embodiment, the thinned organic insulating layer 14 may have a thickness from 300 nm to 500 nm.

Based on the above, considering that the liquid organic insulating material has greater surface covering capability, to better protect a side surface of the formed organic semiconductor active layer 13 perpendicular to the base substrate 10, in at least one embodiment, the organic insulating thin film 140 can be formed by a solution coating process.

In at least one embodiment, as shown in FIG. 16(a), or FIG. 16(b), or FIG. 16(c), or FIG. 16(d), the above step S35, for example, may include steps of: by using an ultraviolet curing process, making ultraviolet light irradiate from the side of the base substrate 10 away from the source electrode 12a, the drain electrode 12b and the gate electrode 11, or away from the source electrode 12a, the drain electrode 12b and the organic semiconductor active layer 13, i.e., from the back side of the base substrate 10, to the first regions $S_1$ of the organic insulating thin film 140 pre-baked at the second temperature, so as to cure the first regions $S_1$ of the organic insulating thin film 140.

Herein, because the source electrode 12a, the drain electrode 12b and the gate electrode 11 or the organic semiconductor active layer 13 are used as a structure for blocking the ultraviolet light, a mask process is saved, further simplifying the preparation process.

In at least one embodiment, as shown in FIG. 18(a), or FIG. 18(b), or FIG. 18(c), or FIG. 18(d), the above step S37, for example, may include steps of: by using an ultraviolet curing process, making the ultraviolet light irradiate from the side of the base substrate 10 close to the source electrode 12a, the drain electrode 12b and the gate electrode 11, or close to the source electrode 12a, the drain electrode 12b and the organic semiconductor active layer 13, i.e., from the front side of the base substrate 10 where respective film layers have been deposited to the second regions $S_2$ of the organic insulating thin film 140 processed by the second etching thinning process, so as to cure the second regions $S_2$ of the organic insulating thin film 140, to form the organic insulating layer 14.

Based on the above, the etching thinning process, for example, may be a plasma etching process.

On the basis of the above, at least one embodiment of the present invention provides an organic thin film transistor 01 prepared by the above preparation method, the organic thin film transistor 01 comprising an organic insulating layer 14 above an organic semiconductor active layer 13; the organic insulating layer 14 is thin and uniform, and its thickness ranges from 300 nm to 500 nm. The term "above the organic semiconductor active layer 13" refers to be on a side of the organic semiconductor active layer 13 away from the base substrate 10.

At least one embodiment of the present invention further provides a preparation method of the array substrate 02 shown in FIG. 19(a), or FIG. 19(b), or FIG. 19(c), or FIG. 19(d), and the preparation method includes steps S41 to S43, which are described one by one hereinafter.

S41: forming an organic thin film transistor, the organic thin film transistor 01 being prepared by using the above preparation method.

S42: forming a planarization layer 20 on an organic insulating layer 14 of the organic thin film transistor, and at least forming a via hole 21 passing through the planarization layer 20 and the organic insulating layer 14, wherein the via hole 21 exposes a drain electrode 12b of the organic thin film transistor.

In the case where the organic semiconductor active layer 13 of the organic thin film transistor covers the drain electrode 12b, the via hole 21 will pass though the organic semiconductor active layer to expose the drain electrode 12b.

Herein, the planarization layer 20, for example, may be made of a photoresist material, a PI (polyimide) material; and its thickness, for example, can be from 500 nm to 2000 nm.

S43: forming a pixel electrode 22 on the planarization layer 20, and the pixel electrode 22 is electrically connected with the drain electrode 12b through the via hole 21.

Figure 19A:
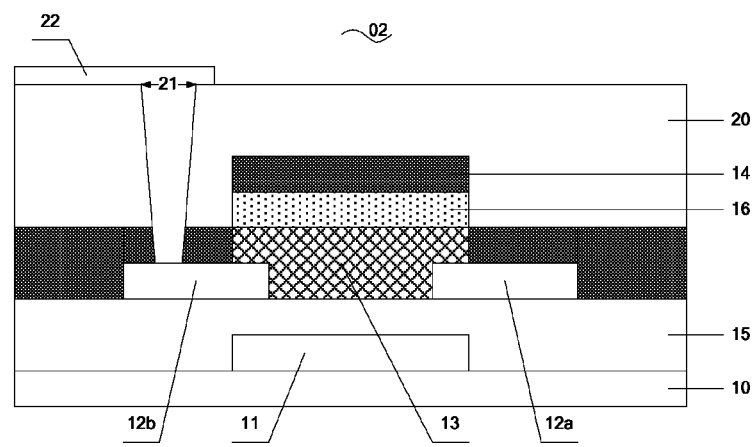
FIG. 19(a), FIG. 19(b), FIG. 19(c) and FIG. 19(d) are structural schematic diagrams I, II, III and IV of an array substrate provided by an embodiment of the present invention, sequentially.
Figure 19B:
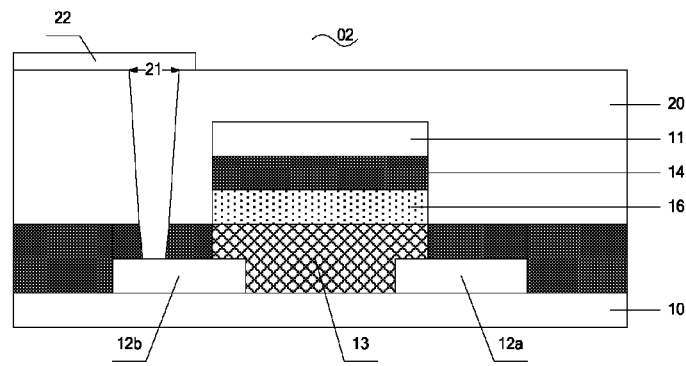
Figure 19C:
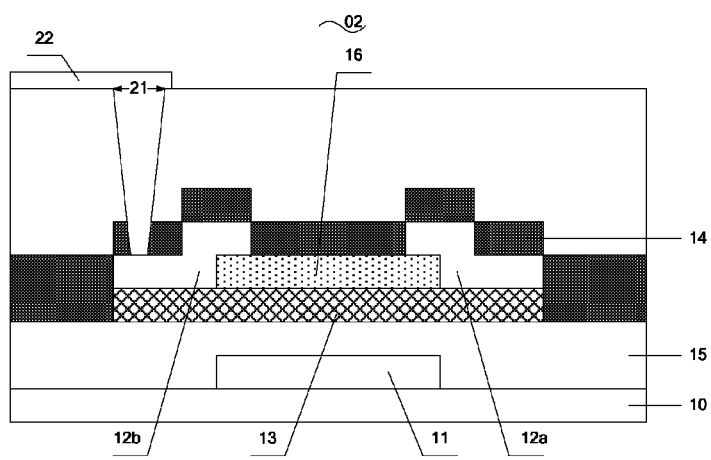
Figure 19D:
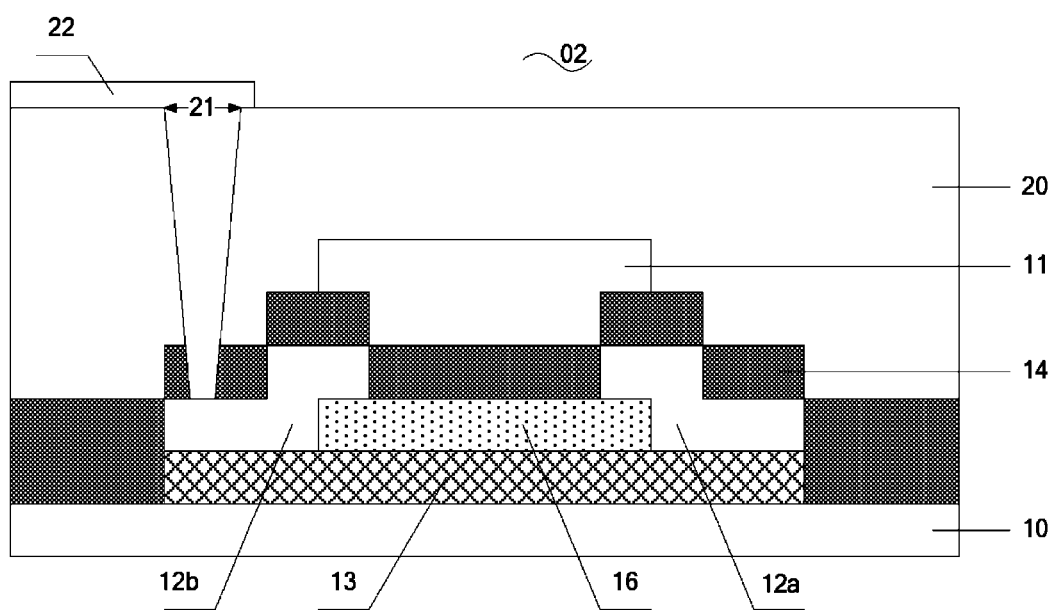

In the step, the organic thin film transistor in FIG. 19(a) is of a bottom-gate bottom-contact type, the organic thin film transistor in FIG. 19(b) is of a top-gate bottom-contact type, the organic thin film transistor in FIG. 19(c) is of a bottom-gate top-contact type, and the organic thin film transistor in FIG. 19(d) is of a top-gate top-contact type.

Because the organic insulating layer 14 between the pixel electrode 22 and the drain electrode 12b is small in film thickness, the technical difficulty in forming a via hole on the organic insulating layer 14 is reduced, the technical reliability is improved, and the method has important value in actual application.

Based on the above, the preparation method of the array substrate 02 may further include forming a common electrode.

On such basis, at least one embodiment of the present invention provides an array substrate 02 prepared by the above preparation method, and the array substrate 02 includes the organic thin film transistor 01 described above. In at least one embodiment, the array substrate further includes a planarization layer 20 located on the organic insulating layer 14 of the organic thin film transistor, and a pixel electrode 22 located on the planarization layer 20; the pixel electrode 22 is electrically connected with the drain electrode 12b through a via hole 21 passing through the planarization layer 20 and the organic insulating layer 14.

At least one embodiment of the present invention further provides a display device, the display device comprising the organic thin film transistor 01 or the array substrate 02.

The display device, for example, may be a liquid crystal panel, a liquid crystal display, a liquid crystal television, an organic light emitting display (OLED) panel, an OLED display, an OLED television or E-paper and other display devices.

It should be noted that, all the drawings of the invention are schematic diagrams/views of the organic thin film transistor and the array substrate, merely to clearly describe the structure reflected in the technical solution related with the invention; other structures unrelated with the invention are the existing structure, which are not or only partially reflected in the drawings.

The above-mentioned is merely an exemplary embodiment of the present invention, which does not intend to restrict the protection scope of the present invention. The protection scope of the present invention is determined by the attached claims.

The present application claims priority of Chinese Patent Application No. 201410319179.7 filed on Jul. 4, 2014, the disclosure of which is incorporated herein by reference in its entirety as part of the present application.

What is claimed is:

1. A preparation method of an organic thin film transistor, comprising:
    forming a source-drain metal layer including a source electrode and a drain electrode, and forming an organic semiconductor active layer, wherein the organic semiconductor active layer is in contact with the source electrode and the drain electrode;
    forming an organic insulating thin film on a substrate where the source-drain metal layer including the source electrode and the drain electrode and the organic semiconductor active layer have been formed;
    thinning the organic insulating thin film by an etching thinning process and curing the thinned organic insulating thin film by a curing process, or curing the organic insulating thin film by a curing process and thinning the cured organic insulating thin film by an etching thinning process, to form an organic insulating layer;
    wherein the preparation method further comprises forming a gate electrode.

2. The preparation method according to claim 1, before forming the organic insulating thin film, further comprising: forming an organic etching blocking layer;
    wherein the organic etching blocking layer is located above the organic semiconductor active layer, and the organic etching blocking layer corresponds to a gap between the source electrode and the drain electrode.

3. The preparation method according to claim 2, wherein the process of forming the source-drain metal layer including the source electrode and the drain electrode, the organic semiconductor active layer, and the organic etching blocking layer includes:
    forming an organic semiconductor thin film and an organic photosensitive thin film sequentially on a substrate where the source-drain metal layer including the source electrode and the drain electrode has been formed;
    after exposing and developing the substrate where the organic photosensitive thin film has been formed by using a common mask plate, forming a completely-retained portion of the organic photosensitive thin film and a completely-removed portion of the organic photosensitive thin film; wherein the completely-retained portion of the organic photosensitive thin film corresponds to a region of an organic semiconductor active layer to be formed, and the completely-removed portion of the organic photosensitive thin film corresponds to rest regions;
    removing the organic semiconductor thin film exposed in the completely-removed portion of the organic photosensitive thin film by an etching process, to form the organic semiconductor active layer; wherein the formed organic semiconductor active layer exposes part of the drain electrode and part of the source electrode; and
    curing the completely-retained portion of the organic photosensitive thin film formed on the organic semiconductor active layer by a curing process, to form the organic etching blocking layer.

4. The preparation method according to claim 2, wherein the process of forming the source-drain metal layer including the source electrode and the drain electrode, the organic semiconductor active layer, and the organic etching blocking layer, includes:
    forming an organic semiconductor thin film and an organic photosensitive thin film sequentially;
    after exposing and developing the substrate where the organic photosensitive thin film has been formed by using a half-tone mask or a gray-tone mask, forming a completely-retained portion of the organic photosensitive thin film, a completely-removed portion of the organic photosensitive thin film, and a half-retained portion of the organic photosensitive thin film, wherein the completely-retained portion of the organic photosensitive thin film corresponds to a region of an organic etching blocking layer to be formed, the half-retained portion of the organic photosensitive thin film corresponds to a region of an organic semiconductor active layer to be formed, where is not covered by the organic etching blocking layer, and the completely-removed portion of the organic photosensitive thin film corresponds to rest regions;

removing the organic semiconductor thin film exposed in the completely-removed portion of the organic photosensitive thin film by an etching process, to form the organic semiconductor active layer;

removing the organic photosensitive thin film in the half-retained portion of the organic photosensitive thin film by an asking process, to expose a region of the organic semiconductor active layer corresponding to the half-retained portion of the organic photosensitive thin film;

curing the completely-retained portion of the organic photosensitive thin film formed on the organic semiconductor active layer by a curing process, to form the organic etching blocking layer; and forming the source-drain metal layer including the source electrode and the drain electrode on the substrate where the organic semiconductor active layer and the organic etching blocking layer have been formed.

5. The preparation method according to claim 3, wherein, after curing the completely-retained portion of the organic photosensitive thin film on the organic semiconductor active layer by the curing process, thinning the cured completely-retained portion of the organic photosensitive thin film by an etching thinning process, to form the organic etching blocking layer; or before curing the completely-retained portion of the organic photosensitive thin film on the organic semiconductor active layer by the curing process, thinning the completely-retained portion of the organic photosensitive thin film by an etching thinning process, to form the organic etching blocking layer.

6. The preparation method according to claim 5, wherein the completely-retained portion of the organic photosensitive thin film thinned by the etching thinning process has a thickness from 300 nm-500 nm.

7. The preparation method according to claim 3, wherein the completely-retained portion of the organic photosensitive thin film formed on the organic semiconductor active layer has a thickness from 500 nm to 1000 nm.

8. The preparation method according to claim 3, wherein the organic photosensitive thin film is formed by a solution coating process.

9. The preparation method according to claim 1, wherein the process of forming the organic insulating layer includes:
forming the organic insulating thin film on the substrate where the source-drain metal layer including the source electrode and the drain electrode and the organic semiconductor active layer have been formed;
pre-baking the formed organic insulating thin film at a first temperature;
thinning the organic insulating thin film pre-baked at the first temperature, by a first etching thinning process;
pre-baking the thinned organic insulating thin film at a second temperature;
curing first regions of the organic insulating thin film pre-baked at the second temperature, by a first curing process; wherein the first regions are rest regions of the organic insulating thin film except regions above the source electrode, above the drain electrode, and above the gap between the source electrode and the drain electrode;
thinning second regions of the organic insulating thin film processed by the first curing process, by a second etching thinning process; wherein the second regions are the regions of the organic insulating thin film above the source electrode, above the drain electrode, and above the gap between the source electrode and the drain electrode; and
curing the second regions of the organic insulating thin film processed by the second etching thinning process, by a second curing process, to form an organic insulating layer.

10. The preparation method according to claim 9, wherein the first temperature is 110° C.-150° C.

11. The preparation method according to claim 9, wherein the second temperature is 150° C.-200° C.

12. The preparation method according to claim 1, wherein the formed organic insulating thin film has a thickness from 500 nm-1000 nm.

13. The preparation method according to claim 1, wherein the formed organic insulating thin film has a thickness from 300 nm-500 nm.

14. The preparation method according to claim 1, wherein the organic insulating thin film is formed by a solution coating process.

15. A preparation method of an array substrate, comprising:
forming the organic thin film transistor, wherein the organic thin film transistor is prepared by the preparation method according to claim 1 described above.

16. The preparation method according to claim 15, further comprising:
forming a planarization layer on the organic insulating layer of the organic thin film transistor, and forming a via hole passing through the planarization layer and the organic insulating layer, wherein the via hole exposes the drain electrode of the organic thin film transistor; and
forming a pixel electrode on the planarization layer, wherein the pixel electrode is electrically connected with the drain electrode through the via hole.

17. The organic thin film transistor, wherein the organic thin film transistor is prepared by the preparation method according to claim 1 described above;
wherein the organic thin film transistor includes the organic insulating layer located above the organic semiconductor active layer, the organic insulating layer having a thickness from 300 nm-500 nm.

18. An array substrate comprising the organic thin film transistor according to claim 17.

19. The array substrate according to claim 18, further comprising: a planarization layer located on the organic insulating layer of the organic thin film transistor, and a pixel electrode located on the planarization layer;
wherein the pixel electrode is at least electrically connected with the drain electrode through a via hole passing through the planarization layer and the organic insulating layer.

* * * * *